(12) United States Patent
Song et al.

(10) Patent No.: US 12,015,074 B2
(45) Date of Patent: Jun. 18, 2024

(54) HIGH ELECTRON MOBILITY TRANSISTOR AND METHOD FOR FORMING THE SAME

(71) Applicant: WIN SEMICONDUCTORS CORP., Taoyuan (TW)

(72) Inventors: Chun-Han Song, Taoyuan (TW); Rong-Hao Syu, Taoyuan (TW); Yu-An Liao, Taoyuan (TW); Chia-Ming Chang, Taoyuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 326 days.

(21) Appl. No.: 17/677,293

(22) Filed: Feb. 22, 2022

(65) Prior Publication Data

US 2022/0310823 A1    Sep. 29, 2022

Related U.S. Application Data

(60) Provisional application No. 63/165,299, filed on Mar. 24, 2021.

(51) Int. Cl.
```
H01L 29/66        (2006.01)
H01L 29/08        (2006.01)
H01L 29/778       (2006.01)
```
(52) U.S. Cl.
CPC .... *H01L 29/66431* (2013.01); *H01L 29/0847* (2013.01); *H01L 29/7786* (2013.01)

(58) Field of Classification Search
None
See application file for complete search history.

(56) References Cited

U.S. PATENT DOCUMENTS

| | | | |
|---|---|---|---|
| 2013/0277680 A1* | 10/2013 | Green | H01L 29/2003 257/E21.409 |
| 2015/0295075 A1 | 10/2015 | Green et al. | |
| 2020/0027872 A1* | 1/2020 | Boles | H01L 21/02381 |
| 2020/0083167 A1* | 3/2020 | LaRoche | H01L 29/475 |
| 2022/0140126 A1* | 5/2022 | LaRoche | H01L 29/7786 257/183 |

OTHER PUBLICATIONS

Chinese language office action dated Jan. 5, 2023, issued in application No. TW 111110984.

* cited by examiner

*Primary Examiner* — Cory W Eskridge
(74) *Attorney, Agent, or Firm* — McClure, Qualey & Rodack, LLP

(57) ABSTRACT

A HEMT structure includes a compound semiconductor substrate, a gate electrode, a source electrode, a drain electrode, a first metal pillar, a second metal pillar, a dielectric layer, and a metal layer. The gate electrode is disposed on the compound semiconductor substrate. The source electrode is disposed on the compound semiconductor substrate at a first side of the gate electrode. The drain electrode is disposed on the compound semiconductor substrate at a second side of the gate electrode. The first metal pillar is disposed on the source electrode. The second metal pillar is disposed on the drain electrode. The dielectric layer is disposed on the compound semiconductor substrate. The dielectric layer surrounds the gate electrode, the first metal pillar, and the second metal pillar. The metal layer is disposed on the dielectric layer. The metal layer straddles the gate electrode, the first metal pillar, and the second metal pillar.

20 Claims, 14 Drawing Sheets

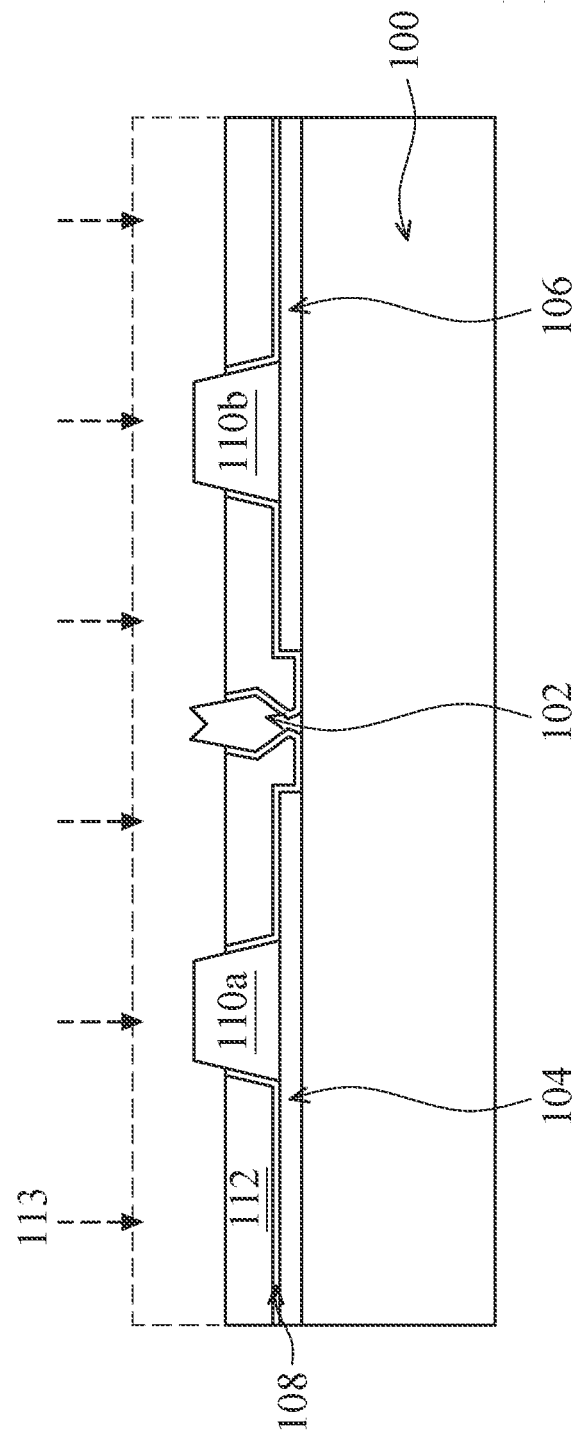

HIGH ELECTRON MOBILITY TRANSISTOR AND METHOD FOR FORMING THE SAME

CROSS REFERENCE TO RELATED APPLICATIONS

This application claims the benefit of U.S. Provisional Application No. 63/165,299, filed on Mar. 24, 2021, the entirety of which is/are incorporated by reference herein.

BACKGROUND

Technical Field

The present disclosure relates to a HEMT (high electron mobility transistor) structure, and more particularly to a HEMT structure with a reduced gate resistance and a method for forming the same.

Description of the Related Art

HEMT structures are widely applied in high-power semiconductor devices due to their high breakdown voltage and high output voltage.

The HEMT structures may have a stack of different III-V semiconductors layers, and heterojunctions may be formed at their interfaces. Due to the band bending at the heterojunctions, a potential well may be formed at the bending conduction band so that a two-dimensional electron gas (2DEG) or a two-dimensional hole gas (2DHG) is formed in the potential well.

Although existing HEMT structures have generally been adequate for their intended purposes, they have not been entirely satisfactory in all respects, and need to be improved.

BRIEF SUMMARY

The present disclosure provides a HEMT structure including a compound semiconductor substrate, a gate electrode, a source electrode, a drain electrode, a first metal pillar, a second metal pillar, a dielectric layer, and a metal layer. The gate electrode is disposed on the compound semiconductor substrate. The source electrode is disposed on the compound semiconductor substrate at a first side of the gate electrode. The drain electrode is disposed on the compound semiconductor substrate at a second side of the gate electrode. The first side is opposite to the second side. The first metal pillar is disposed on the source electrode. The second metal pillar is disposed on the drain electrode. The dielectric layer is disposed on the compound semiconductor substrate. The dielectric layer surrounds the gate electrode, the first metal pillar, and the second metal pillar. The metal layer is disposed on the dielectric layer. The metal layer straddles the gate electrode, the first metal pillar, and the second metal pillar.

The present disclosure also provides a HEMT structure including a gate electrode, source/drain electrodes, metal pillars, a first dielectric layer, and a first metal layer. The gate electrode is disposed on a substrate. The source/drain electrodes are disposed on the substrate at opposite sides of the gate electrode. The metal pillars are disposed on the source/drain electrodes. The first dielectric layer is surrounding the bottom portion of the gate electrode and the bottom portions of the metal pillars. The first metal layer is disposed on the first dielectric layer. The first metal layer covers the top surfaces and the top portion of the sidewalls of the metal pillars.

The present disclosure also provides a method for forming a HEMT structure. The method includes forming a gate electrode on a compound semiconductor substrate. The method also includes forming a source electrode and a drain electrode on the compound semiconductor substrate at opposite sides of the gate electrode respectively. The method also includes forming a first metal pillar and a second metal pillar on the source electrode and the drain electrode respectively. The method also includes forming a dielectric layer on the compound semiconductor substrate to cover the gate electrode, the first metal pillar, and the second metal pillar. The method also includes thinning the dielectric layer to expose the top of the gate electrode, the top of the first metal pillar, and the top of the second metal pillar. The bottom of the gate electrode, the bottom of the first metal pillar, and the bottom of the second metal pillar are surrounded by the remaining portion of the dielectric layer. The method also includes forming a metal layer on the remaining portion of the dielectric layer. The metal layer straddles the top of the gate electrode, the top of the first metal pillar, and the top of the second metal pillar.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1F are cross-sectional representations of various stages of forming a HEMT structure in accordance with some embodiments.

DETAILED DESCRIPTION

Figure 1A:
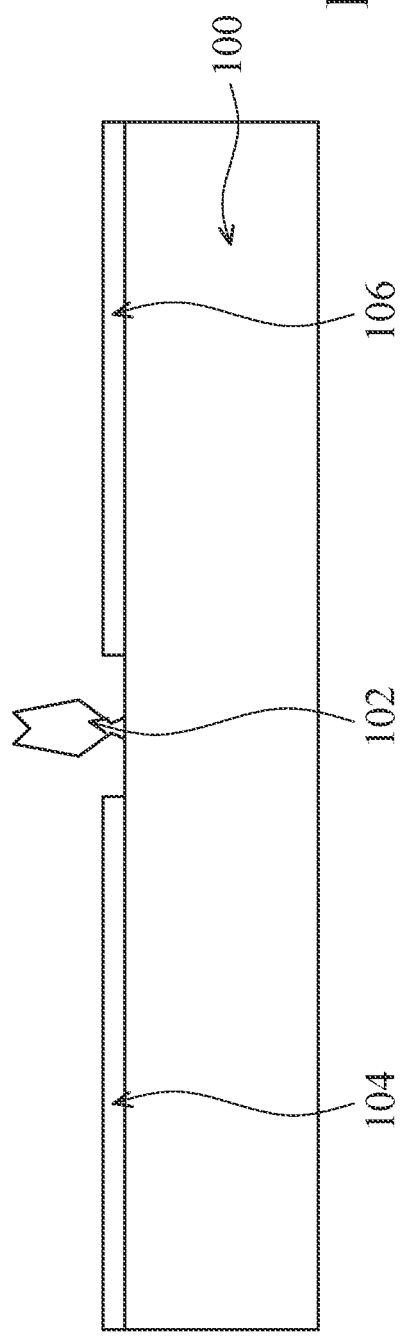

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the semiconductor structure in the present disclosure. Some of the features described below can be replaced or eliminated for different embodiments.

The present disclosure provides a HEMT structure (e.g., a pHEMT structure). The HEMT structure includes a gate electrode, a source electrode, and a drain electrode. The HEMT structure also includes metal pillars on the source electrode and the drain electrode. A dielectric layer is formed to cover the gate electrode and the metal pillars, and then is thinned (e.g., with an etching back process) to expose the gate electrode and the metal pillars. Afterwards, a metal layer is formed to straddle the gate electrode and the metal pillars. Therefore, vias in the dielectric layer may be replaced by metal pillars as the connection between the metal layer and the source/drain electrodes, thus avoiding the alignment issue and the cracking issue resulting from the formation of the vias. In addition, since the gate electrode is straddled by the metal layer formed on the thinned dielectric layer, the gate resistance may be reduced.

FIGS. 1A-1F are cross-sectional representations of various stages of forming a HEMT structure 10 in accordance with some embodiments. FIG. 1A illustrates a cross-sectional view of a HEMT structure 10 according to some embodiments of the present disclosure. The HEMT structure 10 may be a pHEMT structure. In some embodiments, the HEMT structure 10 is used in a power amplifier operating at a high frequency (e.g., at MHz frequencies, or at THz frequencies). For example, the HEMT structures according to embodiments of the present disclosure may be used in power amplifiers operating at D-band (in a range between 110 GHz and 170 GHz) or UHF band (in a range between 300 MHz and 3 GHz).

The HEMT structure 10 includes a compound semiconductor substrate 100, as shown in FIG. 1A in accordance with some embodiments. The compound semiconductor substrate 100 may include III-V compound semiconductors (e.g., GaAs, GaN, AlGaN, AlN, GaAs, AlGaAs, InP, InAlAs, InGaAs, GaSb, or a combination thereof). In some embodiments, the compound semiconductor substrate 100 includes a base layer and epitaxial layers formed on the base layer.

In some embodiments, the compound semiconductor substrate 100 includes a base layer, a buffer layer, a channel layer, a carrier supply layer and a Schottky barrier layer. The buffer layer may be formed on the base layer, and the channel layer may be formed on the buffer layer. The carrier supply layer may be formed on the channel layer, and the Schottky barrier layer may be formed on the carrier supply layer. In some embodiments, the base layer includes GaAs, the buffer layer includes at least one of GaAs and AlGaAs. In some embodiments, the channel layer includes at least one of GaAs and InGaAs, and the carrier supply layer includes at least one of AlGaAs, AlGaAsP and InAlGaAs. The Schottky barrier layer may be a single-layer structure or a multi-layer structure. In some embodiments, the Schottky barrier layer includes AlGaAs, AlGaAsP, InAlGaAs, InGaP, InGaPAs, AlInGaP, or a combination thereof. In some embodiments, the base layer, a buffer layer, a channel layer, a carrier supply layer and a Schottky barrier layer are formed by molecular-beam epitaxy (MBE), metalorganic chemical vapor deposition (MOCVD), hydride vapor phase epitaxy (HYPE), other suitable methods, or a combination thereof.

Since the channel layer and the carrier supply layer may be formed of different materials, their band gaps may be different. A heterojunction may be formed at the interface between the channel layer and the carrier supply layer. The energy band may bend at the heterojunction, and a quantum well may be formed at the deep portion of the conduction band. The electrons produced by piezoelectricity may be confined in the quantum well. Therefore, a two-dimensional electron gas (2DEG) may be formed at the interface between the channel layer and the carrier supply layer, and a conducting current may be formed by the 2DEG.

Next, a gate electrode 102 is formed over the compound semiconductor substrate 100, as shown in FIG. 1A in accordance with some embodiments. The gate electrode 102 may include molybdenum (Mo), tungsten (W), tungsten-silicide (WSi), titanium (Ti), tungsten-titanium (TiW), iridium (Ir), palladium (Pd), platinum (Pt), nickel (Ni), cobalt (Co), chromium (Cr), ruthenium (Ru), osmium (Os), rhodium (Rh), tantalum (Ta), tantalum nitride (TaN), aluminum (Al), rhenium (Re), other applicable conductive materials, or a combination thereof The gate electrode 102 may be formed by a physical vapor deposition (PVD) process (such as resistive heating evaporation, e-beam evaporation, or sputtering), a chemical vapor deposition (CVD) process (such as a low pressure chemical vapor deposition process or a plasma enhanced chemical vapor deposition process), electroplating, atomic layer deposition (ALD), other suitable process, or a combination thereof. In some embodiments, the gate electrode 102 is formed by an evaporation process. In some embodiments, the gate electrode 102 has a crown shape. The gate electrode 102 and the compound semiconductor substrate 100 may form a Schottky contact therebetween.

Next, a source electrode 104 and a drain electrode 106 are formed over the compound semiconductor substrate 100, as shown in FIG. 1A in accordance with some embodiments. The source electrode 104 and the drain electrode 106 may respectively include Ti, Al, W, Au, Pd, Au, Ge, Ni, Mo, Pt, other applicable metals, their alloys, or a combination thereof. The source electrode 104 and the drain electrode 106 may be formed by a physical vapor deposition (PVD)

process (such as resistive heating evaporation, e-beam evaporation, or sputtering), a chemical vapor deposition (CVD) process (such as a low pressure chemical vapor deposition process or a plasma enhanced chemical vapor deposition process), electroplating, atomic layer deposition (ALD), other suitable process, or a combination thereof. In some embodiments, the source electrode 104 and the drain electrode 106 are formed by an evaporation process. The source electrode 104 and the compound semiconductor substrate 100 may form an ohmic contact therebetween, and the drain electrode 106 and the compound semiconductor substrate 100 may form an ohmic contact therebetween. The pattern of the source electrode 104 and the drain electrode 106 may be formed by a metal mask.

Figure 1B:
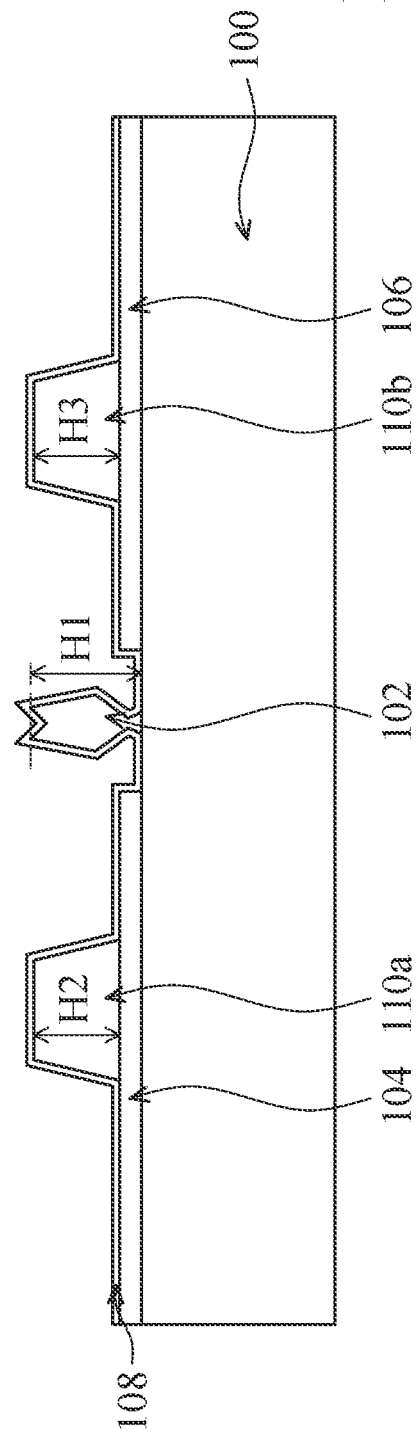

Next, a metal pillar 110a is formed over the source electrode 104 and a metal pillar 110b is formed over the drain electrode 106 respectively, as shown in FIG. 1B in accordance with some embodiments. In some embodiments, the top surfaces of the metal pillar 110a and the metal pillar 110b and the top surface of the gate electrode 102 are at a substantially same level, as shown in FIG. 1B. The metal pillar 110a and the metal pillar 110b may include conductive material such as Au, Ti, Al, Pd, Pt, Cu, W, other suitable metal, its alloy, or a combination thereof. The metal pillar 110a and the metal pillar 110b may be formed by a physical vapor deposition (PVD) process (such as resistive heating evaporation, e-beam evaporation, or sputtering), a chemical vapor deposition (CVD) process (such as a low pressure chemical vapor deposition process or a plasma enhanced chemical vapor deposition process), electroplating, atomic layer deposition (ALD), other suitable process, or a combination thereof. In some embodiments, the metal pillar 110a and the metal pillar 110b are formed by an evaporation process. In some embodiments, the bottom surface of each of the metal pillar 110a and the metal pillar 110b is wider than the top surface of each of the metal pillar 110a and the metal pillar 110b. In some embodiments, each of the metal pillar 110a and the metal pillar 110b has a trapezoid shape. In some embodiments, the top surface of the gate electrode 102 is higher than the top surface of each of the metal pillar 110a and the metal pillar 110b. In some embodiments, the top surface of the gate electrode 102 is substantially level with the top surface of each of the metal pillar 110a and the metal pillar 110b.

As shown in FIG. 1B, the gate electrode 102 has a first height H1, the metal pillar 110a has a second height H2, and the metal pillar 110b has a third height H3. The ratio of the first height H1 to the second height H2 may be in a range between 1 and 5 (e.g., in a range between 1 and 2.5), and the ratio of the first height H1 to the third height H3 may be in a range between 1 and 5 (e.g., in a range between 1 and 2.5). The ratio of the first height H1 to the second height H2 and the ratio of the first height H1 to the third height H3 may be adjusted so that the top surfaces of the gate electrode 102 and the metal pillars 110a and 110b are at a substantially same level.

Afterwards, an adhesion layer 108 is conformally formed over the compound semiconductor substrate 100, the gate electrode 102, the metal pillars 110a and 110b, the source electrode 104, and the drain electrode 106, as shown in FIG. 1B in accordance with some embodiments. The adhesion layer 108 may improve the adhesion between the conductive parts (e.g., the gate electrode 102, the source electrode 104, the drain electrode 106, the metal pillars 110a and 110b) of the HEMT structure 10 and the subsequently formed first dielectric layer 112. In some embodiments, the adhesion layer 108 is made of silicon nitride.

Next, a dielectric layer material is formed over the adhesion layer 108, as shown in FIG. 1C in accordance with some embodiments. The dielectric layer material may cover the gate electrode 102 and the metal pillars 110a and 110b, the source electrode 104, and the drain electrode 106. The dielectric layer material is shown in dashed line in FIG. 1C. The dielectric layer material may be made of a polymer material such as benzocyclobutene (BCB), polyimide, polybenzoxazole (PBO), silicone, acrylates, siloxane, other suitable materials, or a combination thereof. In some embodiments, the dielectric layer material is made of benzocyclobutene (BCB). In some embodiments, the dielectric constant of the dielectric layer material is lower than that of the adhesion layer 108. The dielectric layer material may be formed by a spin coating process followed by a curing process.

Later, the dielectric layer material is thinned, and the first dielectric layer 112 is formed, as shown in FIG. 1C in accordance with some embodiments. In some embodiments, the dielectric layer material is etched back in an etching process 113. Therefore, the top surface of the first dielectric layer 112 is lower than the top portion of the gate electrode 102 and the top portion of the metal pillars 110a and 110b. The top surface of the first dielectric layer 112 is substantially planar. The substantially planar top surface may be used as a platform for a metal layer (e.g., a metal wiring layer) formed thereon.

Top portions of the adhesion layer 108 may be also removed during the etching process 113. In some embodiments, as shown in FIG. 1C, the top portions of the gate electrode 102 and the metal pillars 110a and 110b are exposed through the first dielectric layer 112. In some embodiments, as shown in FIG. 1C, sidewalls of the top portion of the gate electrode 102, sidewalls of the top portion of the metal pillar 110a, and sidewalls of the top portion of the metal pillar 110b are exposed by the first dielectric layer 112. Therefore, the adhesion layer 108 lines the bottom portions of the gate electrode 102 and the metal pillars 110a and 110b, but does not line the top portions of the gate electrode 102 and the metal pillars 110a and 110b. The etching process 113 may include a dry etching process (e.g., reactive ion etching (RIE), an anisotropic plasma etching method), a wet etching process, or a combination thereof.

Figure 1D:
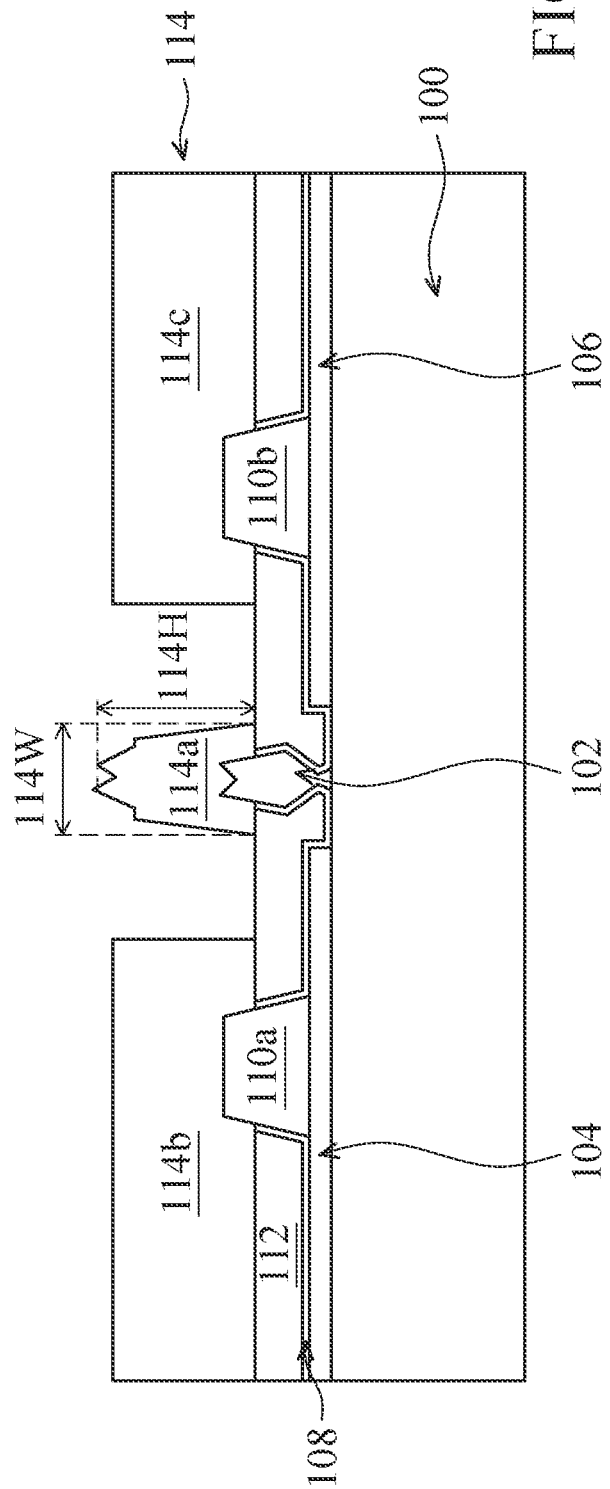

Next, a first metal layer 114 is formed over the gate electrode 102 and the metal pillars 110a and 110b, as shown in FIG. 1D in accordance with some embodiments. In some embodiments, as shown in FIG. 1D, the first metal layer 114 includes a portion 114a, a portion 114b, and a portion 114c. In some embodiments, the portion 114a straddles the gate electrode 102, the portion 114b straddles the metal pillar 110a, and the portion 114c straddles the metal pillar 110b. In some embodiments, the first metal layer 114 covers top surfaces and top portion of the sidewalls of the metal pillars 110a and 110b.

In some embodiments, a width of the portion 114a of the first metal layer 114 is greater than a width of the gate electrode 102, reducing the gate resistance. The top portions of the gate electrode 102 and the metal pillars 110a and 110b may provide electrical connections to the first metal layer 114. In some embodiments, the portion 114a of the first metal layer 114 has a mountain shape.

In some embodiments as shown in FIG. 1D, the portion 114a of the first metal layer 114 has a width 114W in a range of about 0.5 μm to about 4 If the portion 114a of the first metal layer 114 is too wide, extra parasitic effect may be produced, and HEMT performance may be degraded. If the portion 114a of the first metal layer 114 is too narrow, gate resistance reduction may be not enough. In some embodiments, the portion 114a of the first metal layer 114 has a height 114H in a range of about 0.5 µm to about 4 If the portion 114a of the first metal layer 114 is too high, the first metal layer 114 may be collapsed during the following process. If the portion 114a of the first metal layer 114 is too low, gate resistance reduction may be not enough.

In some embodiments, as shown in FIG. 1D, the adhesion layer 108 lines the bottom portions of the gate electrode 102 and the metal pillars 110a and 110b. In some embodiments, as shown in FIG. 1D, the first metal layer 114 is in direct contact with the first dielectric layer 112 and the adhesion layer 108. In some embodiments, the bottom surface of the first metal layer 114a over the gate electrode 102 is substantially level with the bottom surface of the first metal layer 114b and 114c over the metal pillars 110a and 110b.

The first metal layer 114 may be made of metal materials such as Co, W, Ru, Al, Mo, Ti, Cu, Au, Pt, metal alloys, other applicable conductive materials, or a combination thereof. The first metal layer material may be deposited by a physical vapor deposition (PVD) process (such as resistive heating evaporation, e-beam evaporation, or sputtering), a chemical vapor deposition (CVD) process (such as a low pressure chemical vapor deposition process or a plasma enhanced chemical vapor deposition process), electroplating, atomic layer deposition (ALD), other suitable process, or a combination thereof. The first metal layer 114 may be patterned by a patterning process. The patterning process may include a photolithography process and etching process. Examples of photolithography processes include photoresist coating, soft baking, mask aligning, exposure, post-exposure baking, developing the photoresist, rinsing and drying. The etching process may be a dry etching process or a wet etching process.

In some embodiments, a dielectric layer material is formed to cover the gate electrode 102 and the metal pillars 110a and 110b, and then is thinned (e.g., by an etching back process) to form the first dielectric layer 112. In some embodiments, the first dielectric layer 112 is formed to surround the gate electrode 102 and the metal pillars 110a and 110b after the formation of the gate electrode 102 and the metal pillars 110a and 110b, and the first metal layer 114 is formed to straddle the gate electrode 102 and the metal pillars 110a and 110b on the first dielectric layer 112, so as to provide electrical connections from the first metal layer 114 to the gate electrode 102, the source electrode 104 and the drain electrode 106. Therefore, the first metal layer 114 may be electrically connected to the gate electrode 102, the source electrode 104 and the drain electrode 106 without forming vias in the first dielectric layer 112. In some embodiments, the first dielectric layer 112 is free of vias connecting to the gate electrode 102, the source electrode 104 and the drain electrode 106.

In some embodiments, as shown in FIG. 1D, the top portions of the gate electrode 102 and the metal pillars 110a and 110b exposed by the first dielectric layer 112 taper in a direction away from the compound semiconductor substrate 100. Therefore, the connection between the first metal layer 114 and gate electrode 102 and the connection between the first metal layer 114 and the metal pillar (e.g., the metal pillars 110a and 110b) may be improved. In some embodiments, the first metal layer 114 is in direct contact with the sidewalls of the top of the gate electrode 102, sidewalls of the top of the first metal pillar 110a, and the sidewalls of the top of the second metal pillar 110b.

Figure 1E:
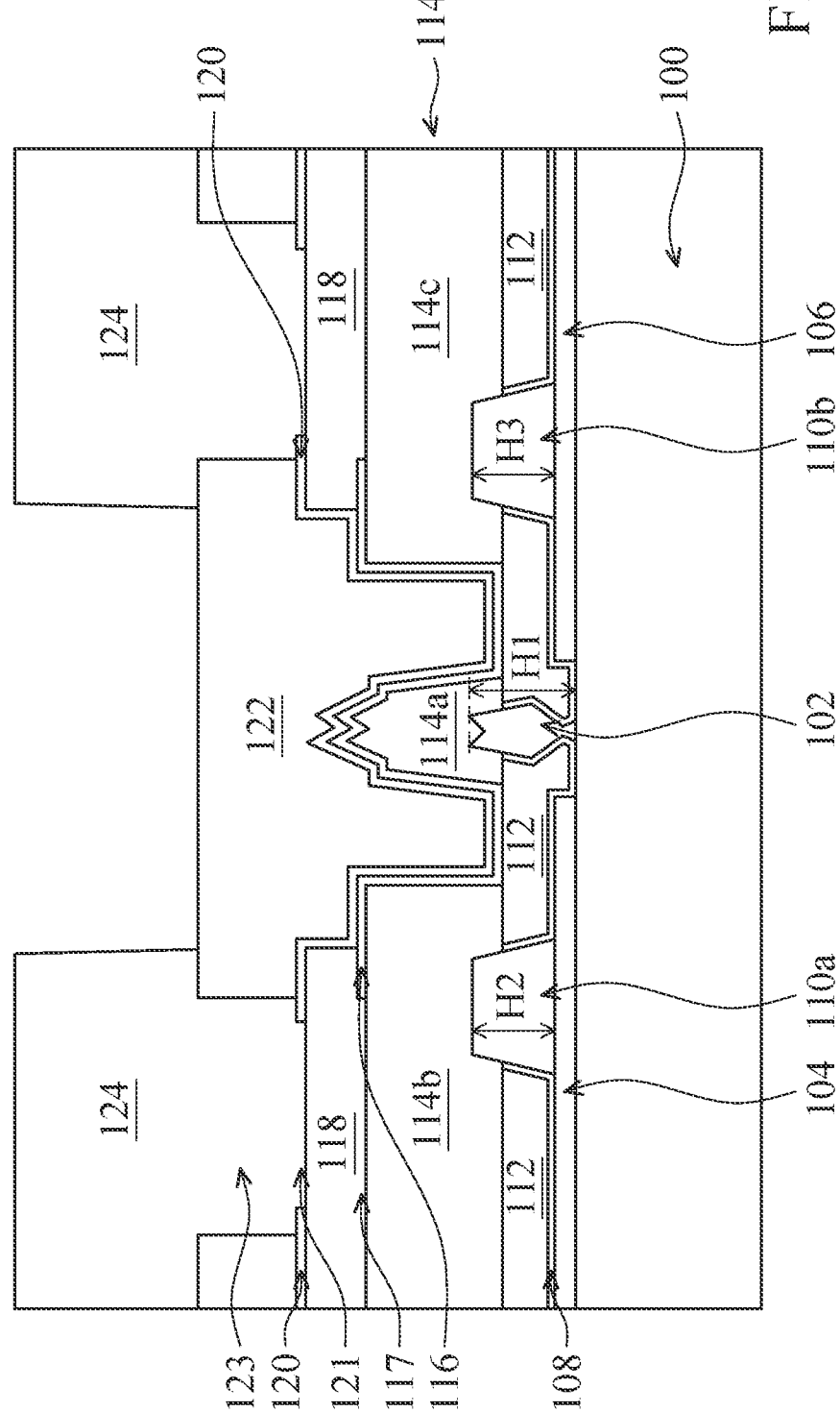

Next, a dielectric layer 116 is formed on the first metal layer 114, and a cap metal layer 118 is formed on the dielectric layer 116, as shown in FIG. 1E in accordance with some embodiments. In some embodiments, the cap metal layer 118 is electrically connected to the first metal layer 114 through a via 117 formed in the dielectric layer 116. In some embodiments, a capacitor is made of the first metal layer 114, the cap metal layer 118, and the dielectric layer 116 inserted therebetween. The dielectric layer 116 may be made of silicon nitride. A dielectric layer material may be conformally deposited over the first metal layer 114 and the first dielectric layer 112 by a CVD process (such as LPCVD, PECVD, SACVD, or FCVD), an ALD process, another applicable method, or a combination thereof. The dielectric layer 116 may be patterned by a patterning process. The patterning process may include a photolithography process and etching process. Processes used to form the cap metal layer 118 may be similar to, or the same as, those used to form the first metal layer 114 described previously and are not repeated herein for brevity.

Next, a moisture resistant layer 120 is formed on the cap metal layer 118, a second dielectric layer 122 is formed on the moisture resistant layer 120, and a second metal layer 124 is formed on the second dielectric layer 122, as shown in FIG. 1E in accordance with some embodiments. In some embodiments, the second metal layer 124 is electrically connected to the cap metal layer 118 through a via 123 formed in the second dielectric layer 122 and a via 121 formed in the moisture resistant layer 120. In some embodiments, the second dielectric layer 122 and the first dielectric layer 112 are made of the same material (e.g., BCB).

The moisture resistant layer 120 may be conformally formed over the cap metal layer 118, the first metal layer 114, and the first dielectric layer 112. The moisture resistant layer 120 may include silicon nitride. The moisture resistant layer material may be deposited over the cap metal layer 118, the first metal layer 114 and the first dielectric layer 112 by a CVD process (such as LPCVD, PECVD, SACVD, or FCVD), an ALD process, another applicable method, or a combination thereof. The moisture resistant layer 120 may be patterned by a patterning process. After the patterning process, an opening is formed over the cap metal layer 118 in the moisture resistant layer 120, and the via 121 is formed in the opening in the moisture resistant layer 120.

Processes used to form the second dielectric layer 122 and the second metal layer 124 may be similar to, or the same as, those used to form the first dielectric layer 112 and the first metal layer 114 described previously, and are not repeated herein for brevity.

Figure 1F:
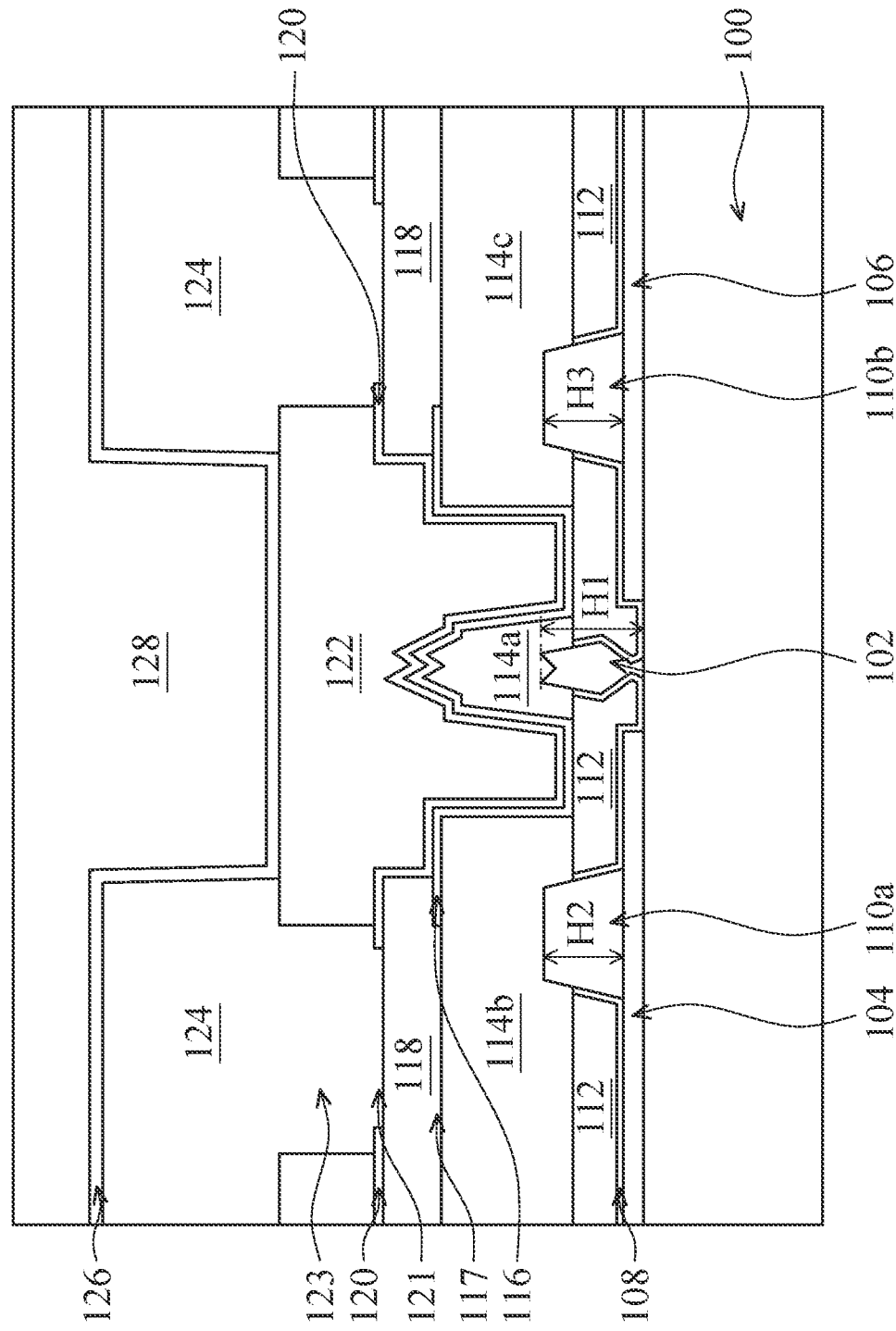

Afterwards, an adhesion layer 126 is formed on the second metal layer 124 and a third dielectric layer 128 is formed on the adhesion layer 126, as shown in FIG. 1F in accordance with some embodiments. The adhesion layer 126 may improve the adhesion between the second metal layer 124 and the third dielectric layer 128. For example, the adhesion layer 126 may be made of silicon nitride, and the third dielectric layer 128 may be made of BCB. In some embodiments, the first dielectric layer 112, the second dielectric layer 122, and the third dielectric layer 128 are made of the same material. Processes used to form the adhesion layer 126 and the third dielectric layer 128 may be similar to, or the same as, those used to form the adhesion layer 108 and the first metal layer 114 described previously, and are not repeated herein for brevity.

Figure 2:
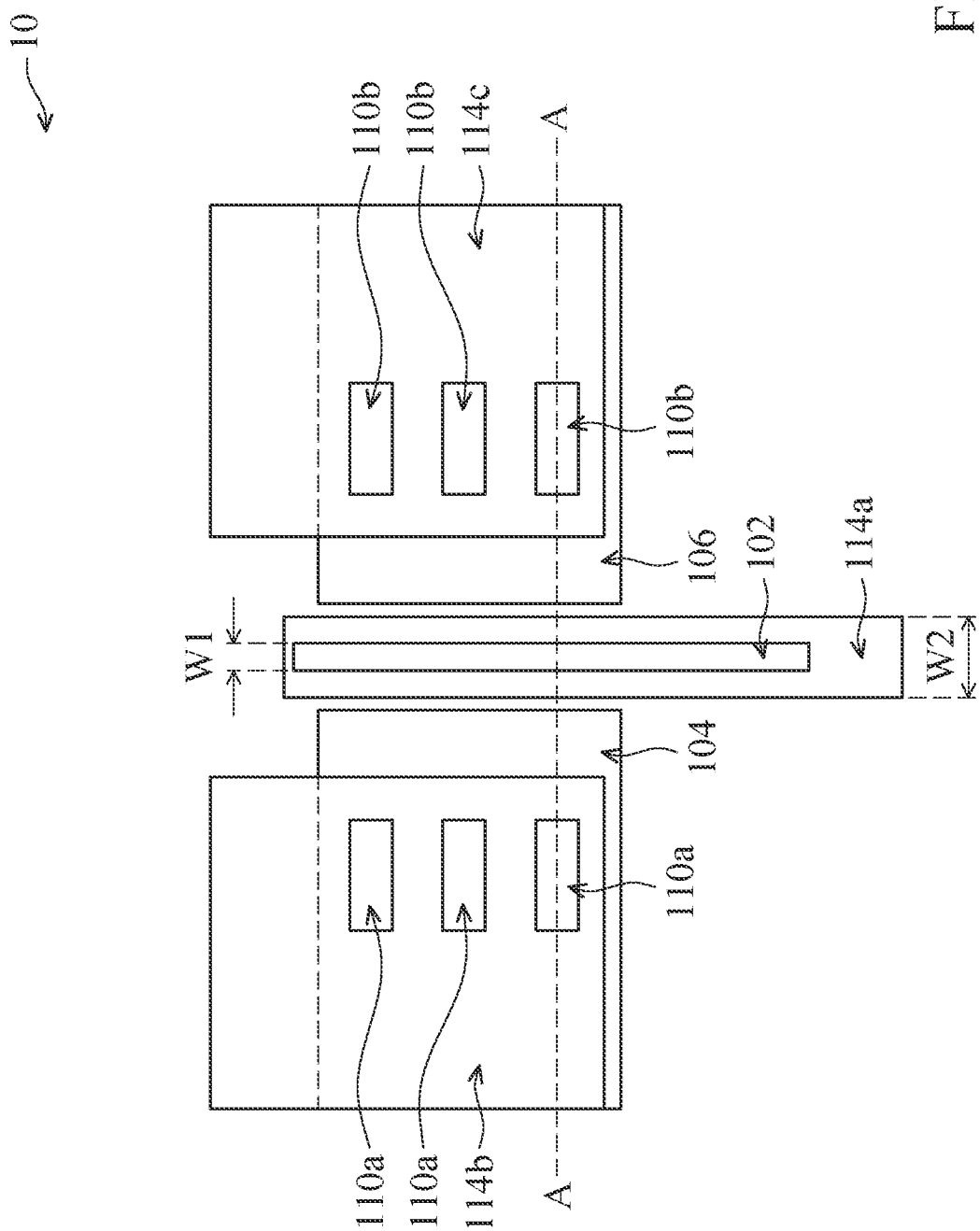
FIG. 2 is a top view of a HEMT structure in accordance with some embodiments.

FIG. 2 is a top view of a HEMT structure 10 in accordance with some embodiments of the present disclosure. FIG. 1 may be a cross-sectional view taken along the line A-A in FIG. 2. In some embodiments, since the gate electrode 102 is straddled by the portion 114a of the first metal layer 114 on the first dielectric layer 112, no vias need to be formed in the first dielectric layer 112 to connect the first metal layer 114 to the gate electrode 102. Therefore, in some embodiments, the gate electrode 102 does not include a pad portion which has an increased width for connection to the vias, improving the miniaturization of the HEMT structure 10. In some embodiments, as shown in FIG. 2, a width W1 of the gate electrode 102 is substantially even along its lengthwise direction. For example, the ratio of the maximum width of the gate electrode 102 to the minimum width of the gate electrode 102 may be in a range between 0.9 and 1.1. In some embodiments, the portion 114a of the first metal layer 114 has a width W2, and the ratio of the width W2 to the width W1 is in a range between 1 and 4 (e.g., in a range between 1.1 and 3). If the ratio of the width W2 to the width W1 is too high, extra parasitic effect may be produced, and HEMT performance may be degraded. If the ratio of the width W2 to the width W1 is too low, gate resistance reduction may be not enough.

In some embodiments, as shown in FIG. 2, the HEMT structure 10 includes a plurality of metal pillars 110a and a plurality of metal pillars 110b. For example, the metal pillars 110a on the source electrode 104 may form an array (e.g., 2×2 array, and 3×3 array), and the metal pillars 110b on the drain electrode 106 may also form an array (e.g., 2×2 array, and 3×3 array). In some embodiments, with the multiple metal pillars 110a and the multiple metal pillars 110b, the etching rate of the etching back process for forming the first dielectric layer 112 is more uniform. Therefore, the first dielectric layer 112 may have a substantially planar top surface, being advantageous to a wiring layer (e.g., the first metal layer 114) formed thereon.

With a first metal layer 114 straddling the gate electrode 102, the gate resistance may be reduced. The via pad structure connecting the first metal layer 114 and the gate electrode 102 may be not necessary, and the area of the HEMT structure 10 may be minimized. The via connecting the first metal layer 114 and the source and drain electrodes 104 and 106 may be replaced by the metal pillars 110a and 110b having top portions protruding from the first dielectric layer 112, and therefore the alignment issue and the cracking issue when forming the via structure may be avoided.

Figure 3:
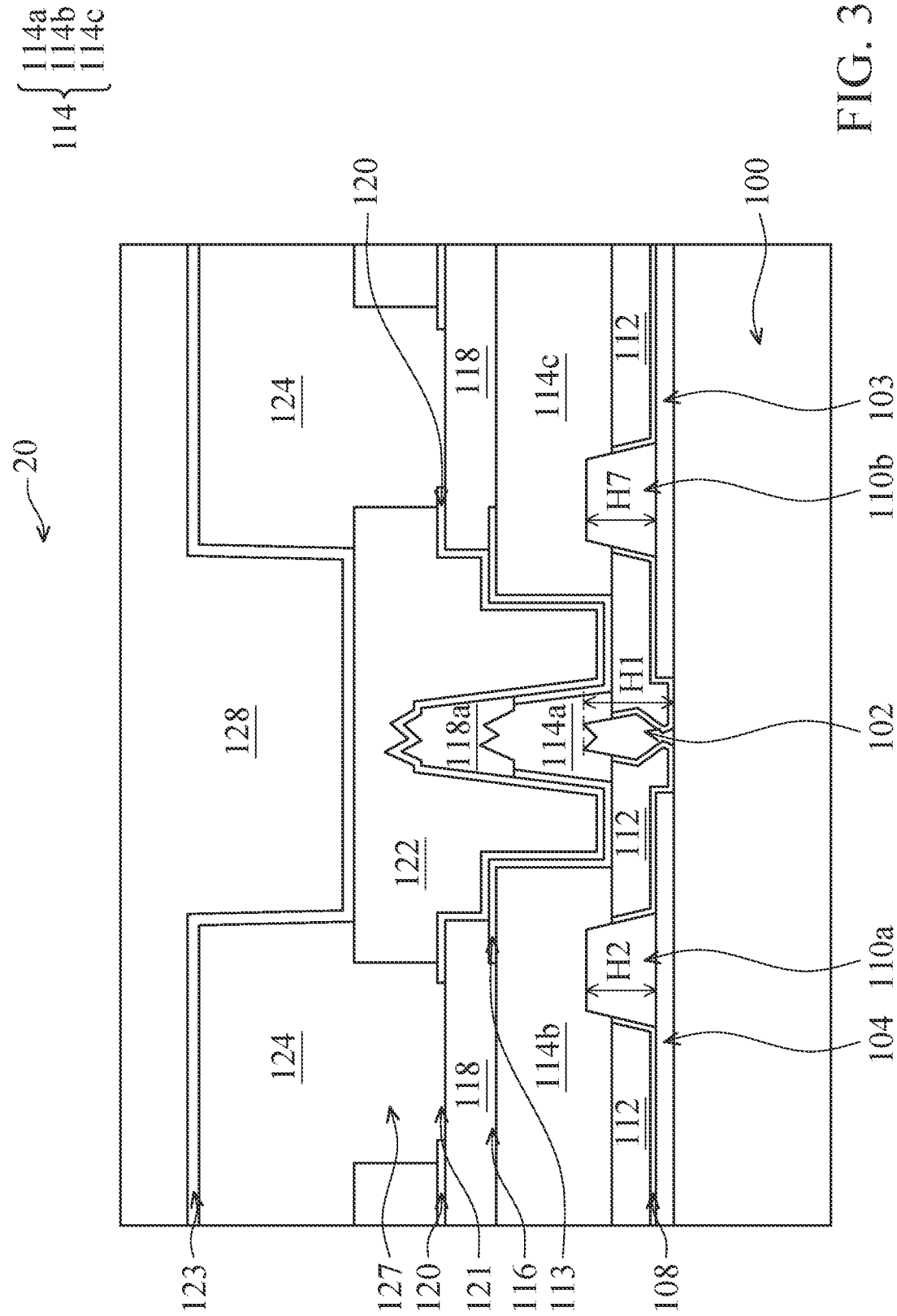
FIG. 3 is a cross-sectional representation of a HEMT structure in accordance with some embodiments.

Many variations and/or modifications may be made to the embodiments of the disclosure. FIG. 3 is a cross-sectional representation of a HEMT structure 20 in accordance with some embodiments. Some processes or devices are the same as, or similar to, those described in the embodiments above, and therefore the descriptions of these processes and devices are not repeated herein. The difference from the embodiments described above is that, as shown in FIG. 3 in accordance with some other embodiments, the cap metal layer 118 of the HEMT structure 20 further includes a portion 118a capping the portion 114a of the first metal layer 114.

In some embodiments, the cap metal layer 118 is conformally formed over the first metal layer 114a. Since the portion 114a of the first metal layer 114a has a mountain shape, the portion 118a over the portion 114a of the first metal layer 114a also has a mountain shape. With the portion 118a of the cap metal layer 118, the gate resistance may be further reduced.

With a first metal layer 114 straddling the gate electrode 102, the gate resistance may be reduced. The via pad structure connecting the first metal layer 114 and the gate electrode 102 may be not necessary, and the area of the HEMT structure 20 may be minimized. The via connecting the first metal layer 114 and the source and drain electrodes 104 and 106 may be replaced by the metal pillars 110a and 110b having top surfaces substantially level with the top surface of the gate electrode 102, and thus the alignment issue and the cracking issue resulting from the formation of the via structure may be avoided. The cap metal layer 118 may also be formed over the first metal layer 114a over the gate electrode 102, and the gate resistance may be further reduced.

Figure 4:
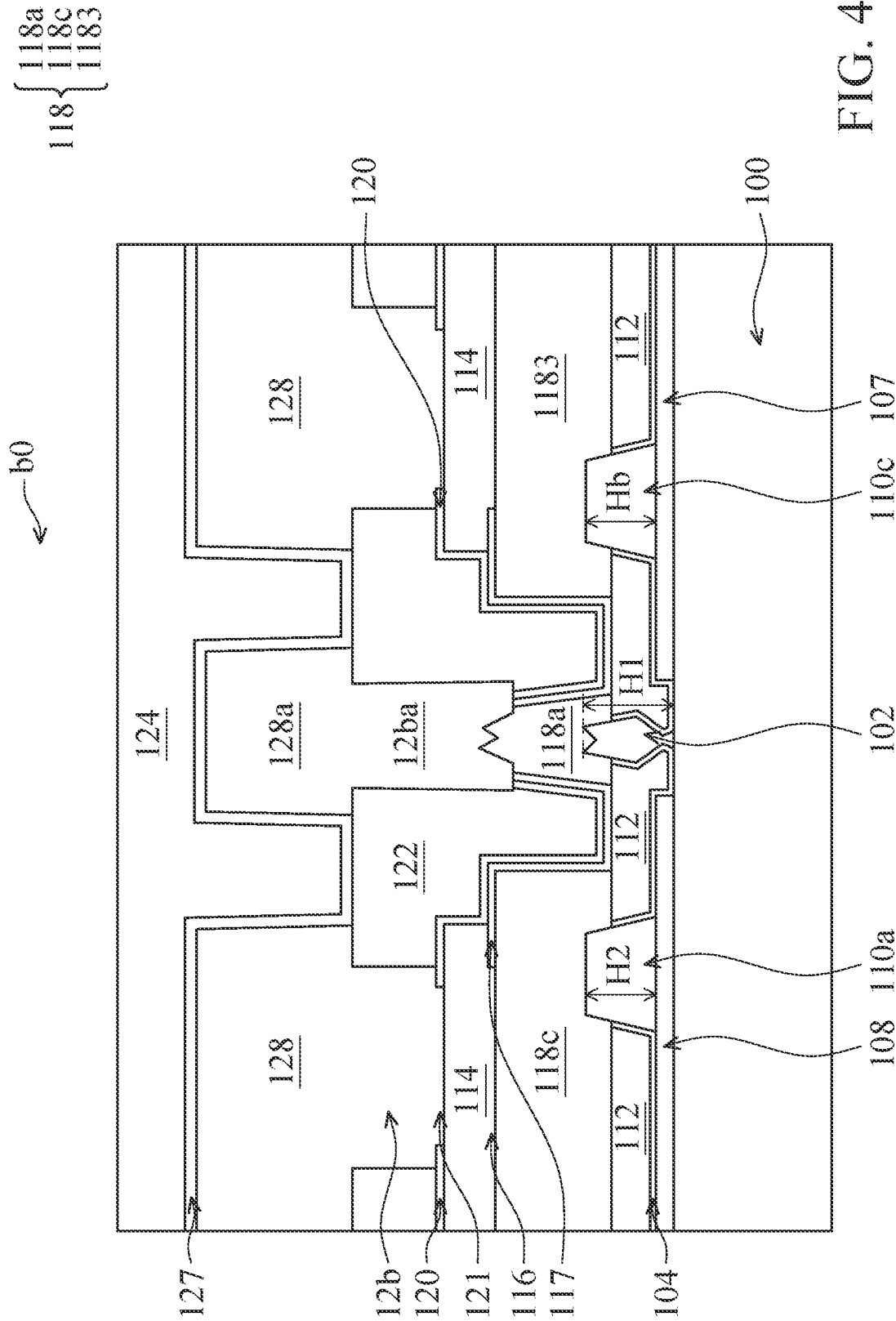
FIG. 4 is a cross-sectional representation of a HEMT structure in accordance with some embodiments.

Many variations and/or modifications may be made to the embodiments of the disclosure. FIG. 4 is a cross-sectional representation of a HEMT structure 30 in accordance with some embodiments. Some processes or devices are the same as, or similar to, those described in the embodiments above, and therefore the descriptions of these processes and devices are not repeated herein. The difference from the embodiments described above is that, as shown in FIG. 4 in accordance with some other embodiments, the second metal layer 124 of the HEMT structure 30 includes a portion 124a electrically connected to the portion 114a of the first metal layer 114 through a via 123a formed in the second dielectric layer 122.

In some embodiments, the second metal layer 124 is in contact with the portion 114a of the first metal layer 114 over the gate electrode while the second metal layer 124 is in contact with the cap metal layer 118 over the metal pillars 110a and 110b. Therefore, the gate resistance may be further reduced.

With a first metal layer 114 straddling the gate electrode 102, the gate resistance may be reduced. The via pad structure connecting the first metal layer 114 and the gate electrode 102 may be not necessary, and the area of the HEMT structure 30 may be minimized. The via connecting the first metal layer 114 and the source and drain electrodes 104 and 106 may be replaced by the metal pillars 110a and 110b, and the alignment issue and the cracking issue when forming the via structure may be avoided. The second metal layer 124 may also be formed over the first metal layer 114a over the gate electrode 102, and the gate resistance may be further reduced.

Figure 5:
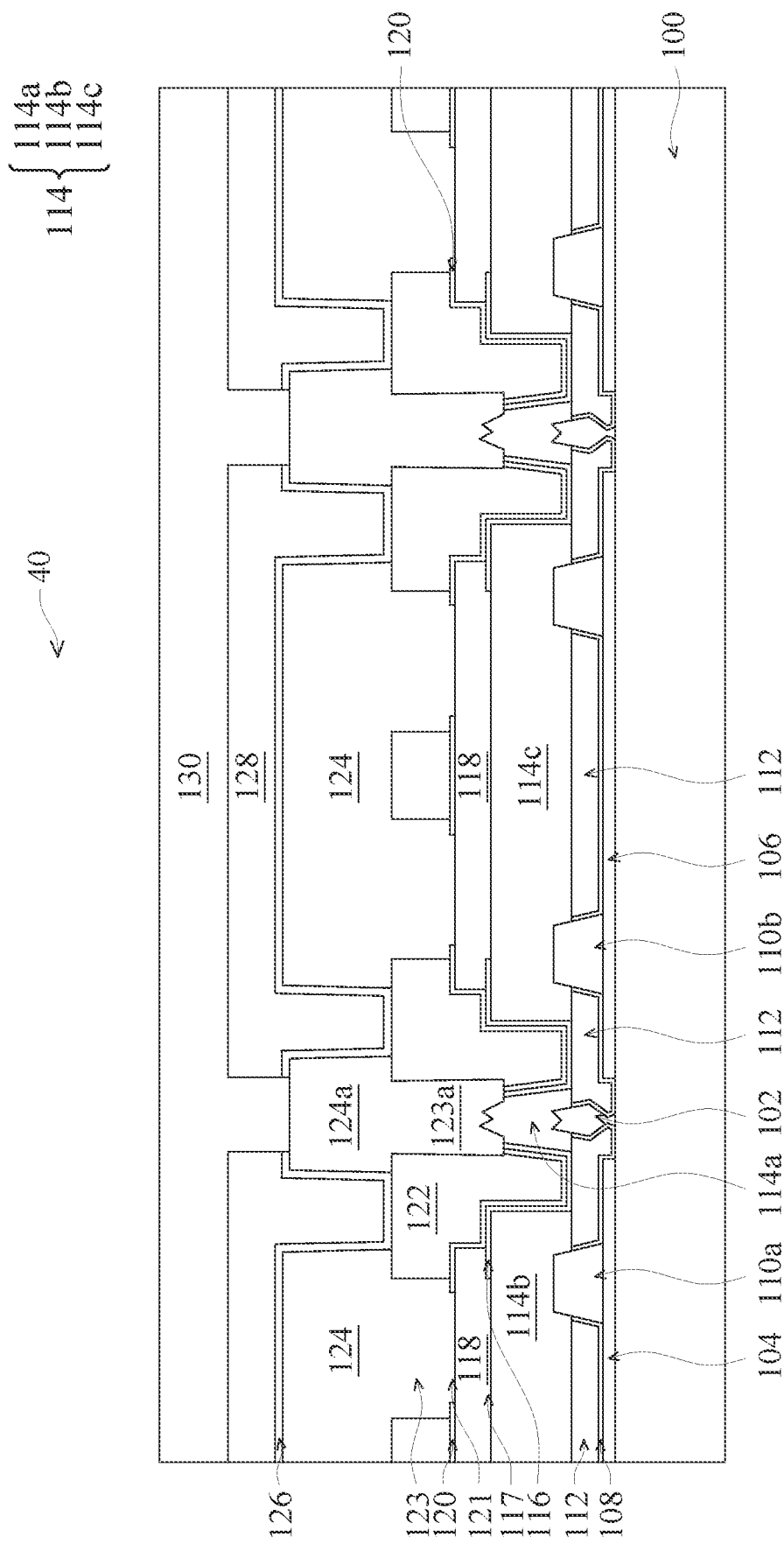
FIG. 5 is a cross-sectional representation of a HEMT structure in accordance with some embodiments.

Many variations and/or modifications may be made to the embodiments of the disclosure. FIG. 5 is a cross-sectional representation of a HEMT structure 40 in accordance with some embodiments. Some processes or devices are the same as, or similar to, those described in the embodiments above, and therefore the descriptions of these processes and devices are not repeated herein. The difference from the embodiments described above is that, as shown in FIG. 5 in accordance with some other embodiments, a metal layer 130 covers the gate electrode 102, the metal pillars 110a and 110b, and the second dielectric layer 122 formed therebetween.

After the third dielectric layer 128 is formed, an opening is formed in the third dielectric layer 128 over the portion 124a of the second metal layer 124 (not shown). The opening may be formed by a lithography process, an etching process, other applicable processes, or a combination thereof.

Afterwards, a third metal layer 130 is formed covering the third dielectric layer 128 and the filling the opening over the portion 124a of the second metal layer 124, as shown in FIG. 5 in accordance with some embodiments. In some embodiments, the third metal layer 130 electrically connects adjacent gate electrodes 102 and may be referred to as a plane gate 130. With the plane gate 130, the gate resistance may be further reduced. In some embodiments, the third metal layer 130 covers the top surface of the third dielectric layer 128 and the second metal layer 124. Processes used to form the third metal layer 130 may be similar to, or the same as, those used to form the first metal layer 114 described previously, and are not repeated herein for brevity.

Figure 6:
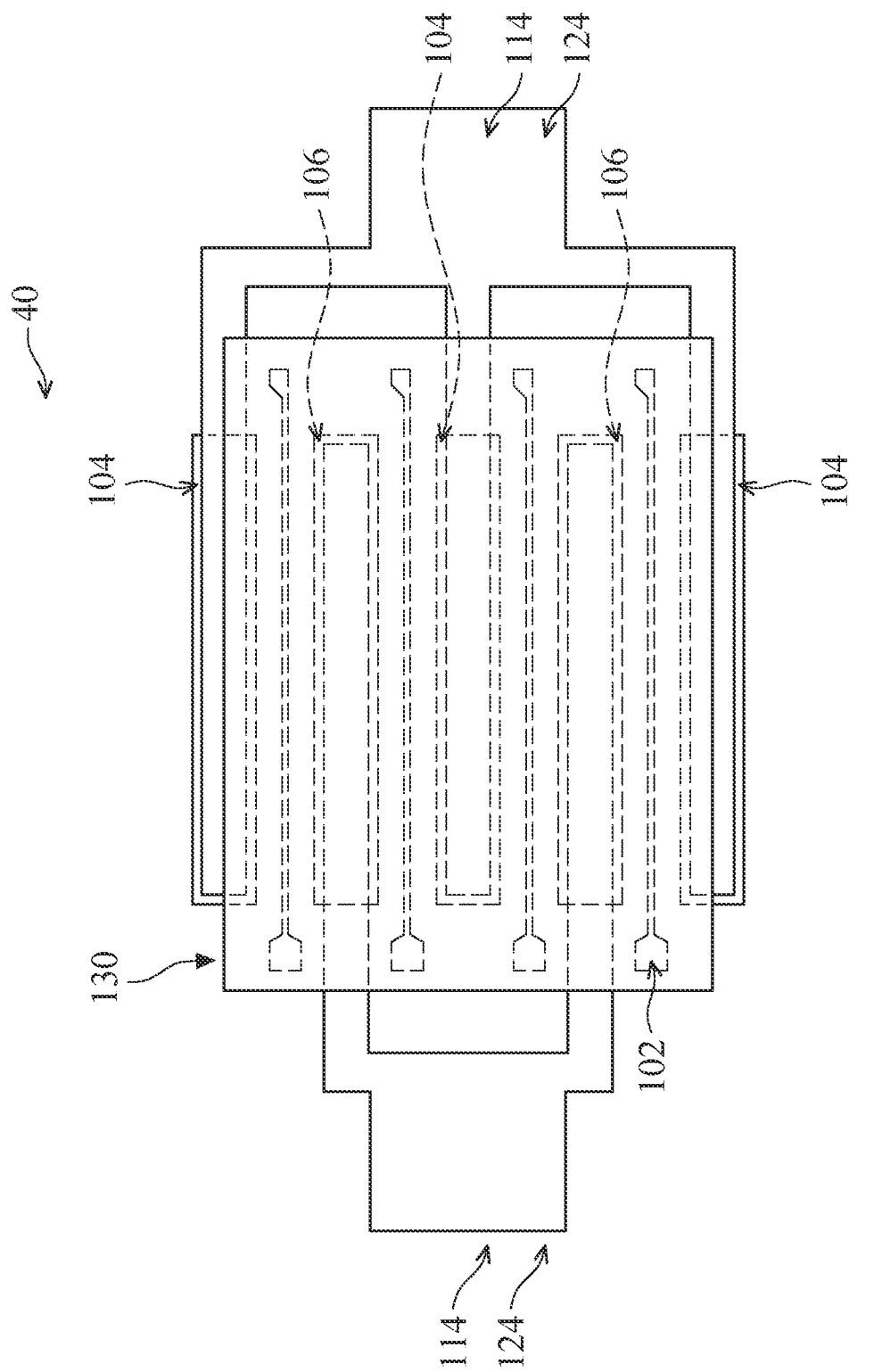
FIG. 6 is a top view of a HEMT structure in accordance with some embodiments.

FIG. 6 is a top view of a HEMT structure 40 in accordance with some embodiments. The first metal layer 114 and the second metal layer 124 may together form comb-shape metal layers, as shown in FIG. 6 in accordance with some embodiments. In some embodiments, the third metal layer 130 covers adjacent gate electrodes 102. In some embodiments, the third metal layer 130 covers multiple gate electrodes 102. In some embodiments, the third metal layer 130 further covers the source electrodes 104 and the drain electrodes 106 formed between the gate electrodes 102.

With a first metal layer 114 straddling the gate electrode 102, the gate resistance may be reduced. The via pad structure connecting the first metal layer 114 and the gate electrode 102 may be not necessary, and the area of the HEMT structure 40 may be minimized. The via connecting the first metal layer 114 and the source and drain electrodes 104 and 106 may be replaced by the metal pillars 110a and 110b, and the alignment issue and the cracking issue when forming the via structure may be avoided. The third metal layer 130 as a plane gate 130 may be formed over the third dielectric layer 128. The gate resistance may be further reduced.

Figure 7:
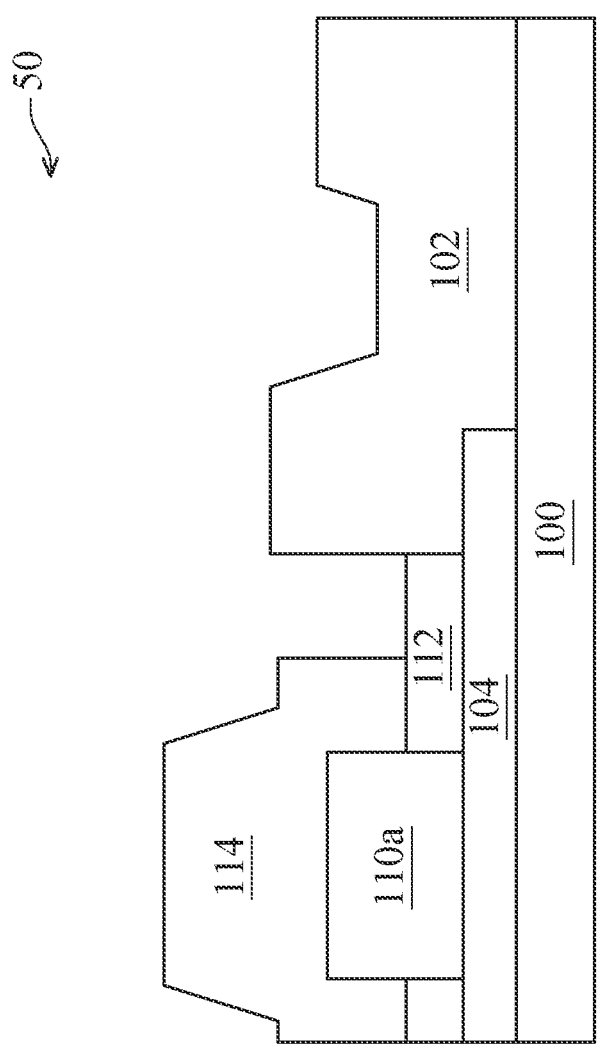
FIG. 7 is an enlarged cross-sectional representation of a HEMT structure in accordance with some embodiments.

Many variations and/or modifications may be made to the embodiments of the disclosure. FIG. 7 is an enlarged cross-sectional representation of a HEMT structure 50 in accordance with some embodiments. Some processes or devices are the same as, or similar to, those described in the embodiments above, and therefore the descriptions of these processes and devices are not repeated herein. The difference from the embodiments described above is that, as shown in FIG. 7 in accordance with some other embodiments, the first metal layer 114 only covers the metal pillars 110a and 110b, but does not cover the gate electrode 102.

In some embodiments, the first metal layer 114 is separated from the gate electrode 102. Processes used to form the first metal layer 114 may be similar to, or the same as, those used to form the first metal layer 114 described previously, and are not repeated herein for brevity.

Since the first metal layer is directly formed over the metal pillars 110a and 110b, the via connecting the first metal layer 114 and the source and drain electrodes 104 and 106 may be replaced by the metal pillars 110a and 110b, and the alignment issue and the cracking issue when forming the via structure may be avoided. The first metal layer 114 may be separated from the gate electrode 102, depending on the design requirements.

Figure 8:
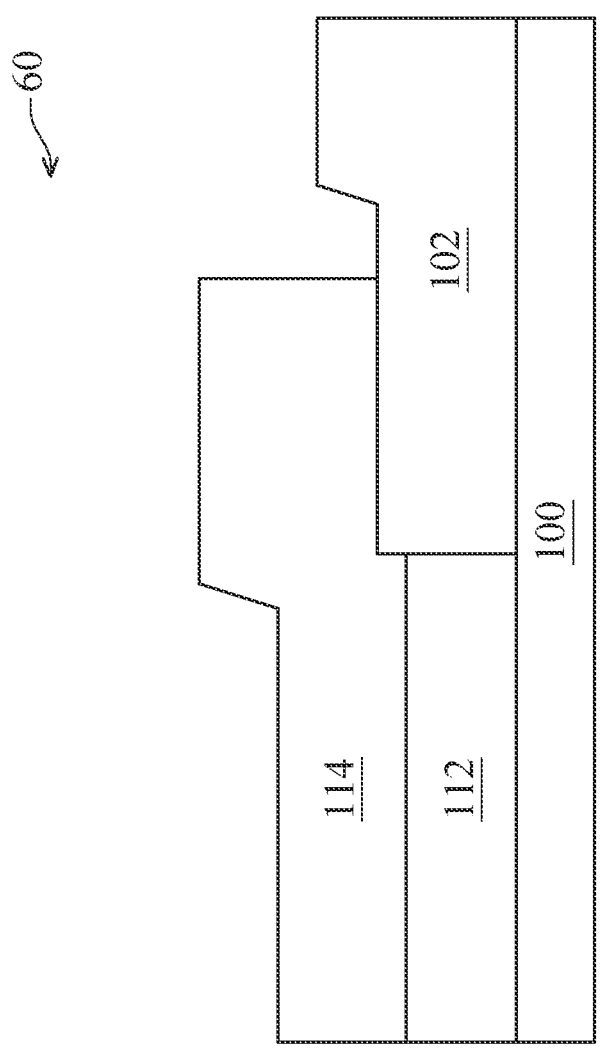
FIG. 8 is an enlarged cross-sectional representation of a HEMT structure in accordance with some embodiments.

Many variations and/or modifications may be made to the embodiments of the disclosure. FIG. 8 is an enlarged cross-sectional representation of a HEMT structure 60 in accordance with some embodiments. Some processes or devices are the same as, or similar to, those described in the embodiments above, and therefore the descriptions of these processes and devices are not repeated herein. The difference from the embodiments described above is that, as shown in FIG. 8 in accordance with some other embodiments, the first metal layer 114 only partially covers the gate electrode 102.

In some embodiments, the first metal layer 114 covers at least a portion of the gate electrode 102. Processes used to form the first metal layer 114 may be similar to, or the same as, those used to form the first metal layer 114 described previously, and are not repeated herein for brevity.

With a first metal layer 114 at least partially covering the gate electrode 102, the gate resistance may be reduced. The via pad structure connecting the first metal layer 114 and the gate electrode 102 may be not necessary, and the area of the HEMT structure 60 may be minimized. The via connecting the first metal layer 114 and the source and drain electrodes 104 and 106 may be replaced by the metal pillars 110a and 110b, and the alignment issue and the cracking issue when forming the via structure may be avoided.

Figure 9:
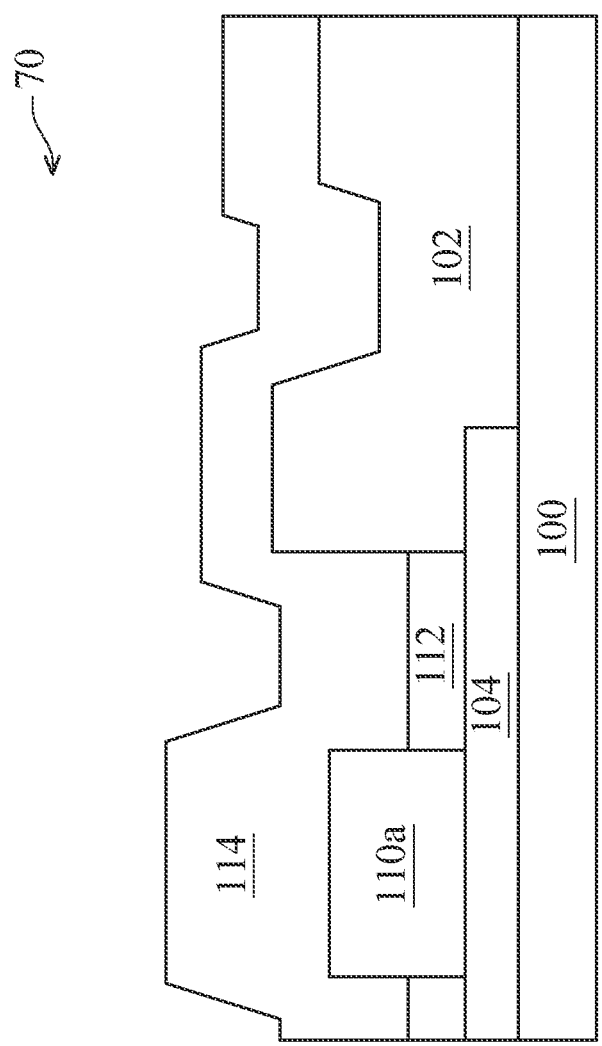
FIG. 9 is an enlarged cross-sectional representation of a HEMT structure in accordance with some embodiments.

Many variations and/or modifications may be made to the embodiments of the disclosure. FIG. 9 is an enlarged cross-sectional representation of a HEMT structure 70 in accordance with some embodiments. Some processes or devices are the same as, or similar to, those described in the embodiments above, and therefore the descriptions of these processes and devices are not repeated herein. The difference from the embodiments described above is that, as shown in FIG. 9 in accordance with some other embodiments, the first metal layer 114 conformally formed over the gate electrode 102 and the metal pillars 110a and 110b.

In some embodiments, the first metal layer 114 covers the top surface of the first dielectric layer 112 between the metal pillar 110a and the gate electrode 102. In some embodiments, the first metal layer 114 is formed between the metal pillar 110a and the gate electrode 102. Processes used to form the first metal layer 114 may be similar to, or the same as, those used to form the first metal layer 114 described previously, and are not repeated herein for brevity.

With a first metal layer 114 straddling the gate electrode 102, the gate resistance may be reduced. The via pad structure connecting the first metal layer 114 and the gate electrode 102 may be not necessary, and the area of the HEMT structure 40 may be minimized. The via connecting the first metal layer 114 and the source and drain electrodes 104 and 106 may be replaced by the metal pillars 110a and 110b, and the alignment issue and the cracking issue when forming the via structure may be avoided. The first metal layer 114 may be also conformally formed over the gate electrode 102 and the metal pillars 110a and 110b.

It should be noted that, although the HEMT structures are shown in the embodiments of the disclosure, the device of the embodiments of the disclosure is not limited thereto. The HEMT structures according to embodiments of the present disclosure may also be integrated with other semiconductor structures (e.g., heterojunction bipolar transistor structure, and thin film resistor structure).

As mentioned above, in the present disclosure, a HEMT structure and a method of forming a HEMT structure is provided. With the first metal layer straddling the gate electrode and the metal pillars, the via connecting the first metal layer and the source and drain electrodes may be replaced by the metal pillars, and the alignment issue and cracking issue may be prevented. In addition, the gate pad via structure may also not be formed, and the HEMT structure area may be reduced. Furthermore, the gate resistance may be also reduced.

It should be noted that although some of the benefits and effects are described in the embodiments above, not every embodiment needs to achieve all the benefits and effects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high electron mobility transistor (HEMT) structure, comprising:
   a compound semiconductor substrate;
   a gate electrode disposed on the compound semiconductor substrate;
   a source electrode disposed on the compound semiconductor substrate at a first side of the gate electrode;
   a drain electrode disposed on the compound semiconductor substrate at a second side of the gate electrode, wherein the first side is opposite to the second side;
   a first metal pillar disposed on the source electrode;
   a second metal pillar disposed on the drain electrode;
   a dielectric layer disposed on the compound semiconductor substrate, wherein the dielectric layer surrounds the gate electrode, the first metal pillar, and the second metal pillar; and
   a metal layer disposed on the dielectric layer, wherein the metal layer straddles the gate electrode, the first metal pillar, and the second metal pillar.

2. The high electron mobility transistor structure as claimed in claim 1, wherein a top surface of the dielectric layer is lower than a top portion of the gate electrode, a top portion of the first metal pillar, and a top portion of the second metal pillar.

3. The high electron mobility transistor structure as claimed in claim 1, wherein the dielectric layer comprises polymer.

4. The high electron mobility transistor structure as claimed in claim 1, wherein a top surface of the dielectric layer is substantially planar.

5. The high electron mobility transistor structure as claimed in claim 1, further comprising:
   an adhesion layer lining a bottom of the gate electrode without lining a top of the gate electrode.

6. The high electron mobility transistor structure as claimed in claim 5, wherein the metal layer is in direct contact with the dielectric layer and the adhesion layer.

7. The high electron mobility transistor structure as claimed in claim 5, wherein a dielectric constant of the dielectric layer is lower than a dielectric constant of the adhesion layer.

8. A high electron mobility transistor (HEMT) structure, comprising:
   a gate electrode disposed on a substrate;
   source/drain electrodes disposed on the substrate at opposite sides of the gate electrode;
   metal pillars disposed on the source/drain electrodes;
   a first dielectric layer surrounding a bottom portion of the gate electrode and bottom portions of the metal pillars; and
   a first metal layer disposed on the first dielectric layer, wherein the first metal layer covers top surfaces and top portion of sidewalls of the metal pillars.

9. The high electron mobility transistor structure as claimed in claim 8, wherein the first metal layer covers at least a portion of a top surface of the gate electrode.

10. The high electron mobility transistor structure as claimed in claim 9, further comprising:
    a cap metal layer disposed on the first metal layer, wherein the cap metal layer is in contact with the first metal layer over the gate electrode.

11. The high electron mobility transistor structure as claimed in claim 8, further comprising:
    a cap metal layer disposed on the first metal layer,
    a second metal layer disposed on the cap metal layer,
    wherein the second metal layer is in contact with the first metal layer over the gate electrode and the cap metal layer over the metal pillars.

12. The high electron mobility transistor structure as claimed in claim 11, further comprising:
    a second gate electrode disposed on the substrate under the first metal layer;
    a third metal layer disposed on the second metal layer,
    wherein the third metal layer is electrically connected to the gate electrode and the second gate electrode.

13. The high electron mobility transistor structure as claimed in claim 8, wherein the gate electrode has a width less than or substantially equal to a width of the first metal layer over the gate electrode.

14. The high electron mobility transistor structure as claimed in claim 8, wherein the first dielectric layer comprises BCB.

15. A method for forming a high electron mobility transistor (HEMT) structure, comprising:
    forming a gate electrode on a compound semiconductor substrate;
    forming a source electrode and a drain electrode on the compound semiconductor substrate at opposite sides of the gate electrode;
    forming a first metal pillar and a second metal pillar on the source electrode and the drain electrode respectively;
    forming a dielectric layer on the compound semiconductor substrate to cover the gate electrode, the first metal pillar, and the second metal pillar;
    thinning the dielectric layer to expose a top of the gate electrode, a top of the first metal pillar, and a top of the second metal pillar, wherein a bottom of the gate electrode, a bottom of the first metal pillar, and a bottom of the second metal pillar are surrounded by a remaining portion of the dielectric layer;
    forming a metal layer on the remaining portion of the dielectric layer, wherein the metal layer straddles the top of the gate electrode, the top of the first metal pillar, and the top of the second metal pillar.

16. The method as claimed in claim 15, wherein thinning the dielectric layer comprises etching back the dielectric layer.

17. The method as claimed in claim 15, wherein the metal layer is in direct contact with sidewalls of the top of the gate electrode, sidewalls of the top of the first metal pillar, and sidewalls of the top of the second metal pillar.

18. The method as claimed in claim 15, before the formation of the dielectric layer, further comprising:
    forming an adhesion layer on the compound semiconductor substrate to cover the gate electrode, the first metal pillar, and the second metal pillar.

19. The method as claimed in claim 18, further comprising:
    removing a portion of the adhesion layer, wherein the removal of the portion of the adhesion layer and the thinning of the dielectric layer comprise an etching back process.

20. The method as claimed in claim 15, wherein a bottom surface of the metal layer on the gate electrode is substantially level with a bottom surface of the metal layer on the first metal pillar and the second metal pillar.

* * * * *